US005886902A

United States Patent [19]
Turrini

[11] Patent Number: 5,886,902
[45] Date of Patent: Mar. 23, 1999

[54] METHOD FOR OPTIMIZING ITEMS REPRESENTED IN PERMUTATION SPACES

[75] Inventor: Silvio Turrini, Palo Alto, Calif.

[73] Assignee: Digital Equipment Corporation, Maynard, Mass.

[21] Appl. No.: 792,740

[22] Filed: Feb. 3, 1997

[51] Int. Cl.$^6$ .............................. G06F 17/50; G06F 17/14
[52] U.S. Cl. .................. 364/491; 364/488; 364/725.01; 364/725.02; 364/725.03; 364/736.03; 364/754.02; 345/427; 345/154; 382/276; 382/277; 382/280
[58] Field of Search .................................. 935/22–24, 79; 364/736.03, 754.02, 491, 728.01, 726.07; 800/215; 345/427; 382/276, 277, 230

[56] References Cited

U.S. PATENT DOCUMENTS

| | | | |
|---|---|---|---|
| 4,156,920 | 5/1979 | Winograd | 364/726 |
| 5,572,236 | 11/1996 | Feig et al. | 345/154 |

OTHER PUBLICATIONS

Pitaksononkul et al., "Bisection trees and half–quad trees: memory and time efficient data structures for VLSI layout editors", Integration, The VLSI Journal, Dec. 1, 1989, pp. 285–300.

Ramanan et al., "Permutation representation of k–ary trees", Theorectical Computer Science, vol. 38, No. 1, pp. 83–98, May 1, 1985.

Joni et al., "On restricted bases for finite fields", Combinatorial Mathematics, Optimal Designs and their Applications, a Symposium, pp. 215–217, Jan. 1, 1980.

Martin, "Transformation between tree permutations and inversion tables", ACM Eighteenths Annual Computer Science Conference Proceedings, pp. 140–146, Jan. 1, 1990.

Wu et al., "Generation of a valid loop permutation graph", Proceedings of the Sixth IASTED/ISMM International Conference: Parallel and Distributed Computing and Systems, pp. 1–3, Jan 1, 1994.

Nyberg, "On the construction of highly nonlinear permutations", Advances in Cryptology–EUROCRYPT '92: Workshop on the Theory and Applications of Cryptographic Techniques, pp. 92–98, Jan. 1, 1993.

Martin et al., "The representation and enumeration of ordered K–ary trees", computing and information: Proceedings of the International Conference, ICCI '89, pp. 105–109, Jan. 1, 1989.

Hsiao, "Nearly balanced qual list qual tree–a data structure for VLSI layout systems", VLSI Design, vol. 4, No. 1, pp. 17–32, Jan. 1, 1996.

Nandy et al., "Dual quadtree representation for VLSI designs", 23rd ACM/IEEE Design Automation Conference, pp. 663–666, Jan. 1, 1986.

Rawlings, "A binary tree decomposition space of permutation statistics", Journal of Combinatrial Theory, Series A, vol. 59, No. 1, pp. 111–124, Jan. 1, 1992.

Yuret et al., "Dynamic Hill Climbing", AI Expert, Mar. 1994, pp. 26–31.

(List continued on next page.)

*Primary Examiner*—Kevin J. Teska
*Assistant Examiner*—Phallaka Kik
*Attorney, Agent, or Firm*—Graham & James LLP

[57] ABSTRACT

In a computer implemented method, possible arrangements of items, such as components to be placed on a semiconductor die, are described in a permutation space expressed as a data structure stored in a memory. The data structure is in the form of a balanced tree. In the tree, each node is a possible permutation. The ordering in the permutation space is transformed to an ordering described in a vector space using an inversion table. A best ordering of items is determined in the vector space according to a predetermined criterion such as an objective function. The best ordering as determined in vector space is then transformed back to the permutation space to determine an optimal placement of the item according to the predetermined criterion.

12 Claims, 12 Drawing Sheets

```
while(/r/> =threshold)
{
    iter= o
    while(f(x+v)> = f(x) && iter <maxIter
    {
        v = randomVector(r);   ++iter
    }
    if(f(x+v)>f(v))
        v=v/2;
    else if(iter==o)
    {
        x = x+v;v=u+v;v=2v,
    }
    else if(f(x+u+v)>f(v))
    {
        x =x+v+v; u =u+v;v= 2u;
    }
    else{x=x+v; u=v; v=2v}
}
```

900

OTHER PUBLICATIONS

Cooley et al., "An Algorithm for the Machine Computation of Complex Fourier Series", Mathematics of Computation, vol. 19, Apr. 1965, pp. 309–315.

Knuth, "The Art of Computer Programming", vol. 3: Sorting and Searching, Addison–Wesley, pp. 11–12, Jan. 1973.

Cooley, P.M. and J.W. Tukey, "An Algorithm for the Machine Computation of Complex Fourier Series" Mathematics of Compuation, vol. 19(Apr. 1965), pp. 309–315.

Goldberg, David, "Genetic Algorithms in Search Optimization & Machine Learning" Addison–Wesley Publishing Company, Inc. 1989 pp. 170–172, Jan. 1989.

Knuth, D.E., "The Art of Computer Programming" vol. 3: Sorting and Searching. Addison–Wesley, pp. 11–12, Jan. 1973.

Deniz Yuret and Michael De La Maza, "Dynamic Hill Climbing," article on AI Expert, Mar. 1994, pp. 26–31.

```
X = { };          // empty set
for (i = 0; i < max Optima; ++ local Optimum)
{
    X = Far Point (X)
    X = X   Local Optima (f, x);
}
```

```
while(//r/> = threshold)
{
    iter = 0
    while(f(x+v) >= f(x) && iter < maxIter
    {
        v = randomVector(r);   ++iter
    }
    if(f(x+v) > f(v))
        v = v/2;
    else if(iter == 0)
    { x = x+v; y = u+v; v = 2v,
    }
    else if(f(x+u+v) > f(v))
    { x = x+v+v; u = u+v; v = 2u;
    }
    else{ x = x+v; u = v; v = 2v}
}
```

METHOD FOR OPTIMIZING ITEMS REPRESENTED IN PERMUTATION SPACES

FIELD OF THE INVENTION

This invention relates generally to data processing, and more particularly to computer implemented methods for optimally ordering permutations of items.

BACKGROUND OF THE INVENTION

Modem computer systems are increasingly being used to solve difficult problems in the real physical world. In computer systems, physical items, or representations of virtual items are stored in memories as data structures. Machine executable instructions manipulate the data to solve optimization problems. Increasingly, the structures and problems are becoming more complex.

For example, computers are frequently used to process images. There, the photons of the physical world are converted to pixels at fixed coordinates, each pixel representing variable light intensity and color values. Optimally manipulating millions of pixels requires a large amount of processing, therefore, quickly finding optimal solutions is an important task for computer scientists and engineers.

In the prior art, techniques for finding optimal solutions to problems posed as linear data structures, such as the images in the example above, e.g., independent variables expressed as vectors, are well know. The vectors, perhaps, describe measurable physical attributes associated with the pixels, i.e., intensity and color. Generally, the time and the location of the pixels are ordered in the memories according to a Cartesian coordinate system.

There, optimization techniques for image registration or motion analysis problems, may focus on reducing the total "distance" between the vectors of pixels in successive image planes. Because the variables are independent and can be represented linearly, many image processing problems can be managed in real time.

However, for many complex items, the mere locations of the items is insufficient to derive an optimal solution. Instead, the relative location of the items to each other is the key element in being able to determine an optimal solution. In other words, the ordering of the items is important.

For example, in genetic analysis, the "decoding" of DNA into its functional items, e.g., genes, must take into consideration the numerous possible permutations in which the genes can be sequenced. That is, the relative ordering of the genes is a significant factor in genetic expressions.

Another difficult optimization problem, this time in the field of electronics, is how to optimally lay out the millions of electronic components on a small semiconductor chip so that signalling paths between the components is minimized in order to maximize performance. Again, here, the possible orderings or placement of electronic items (cells) are usually expressed in a permutation space or domain.

More generally and formally, optimization problems where the domains of the parameters to be optimized are described as sets of independent variables are said to belong in a Cartesian, linear, or vector space. Optimization problems where the domains of the variables depends on their order are said to belong in a permutation space.

In the case of vector spaces, the values of the variables are independent of each other, and the optimizing function can typically be geometrically represented in a space which has as many dimensions as there are variables.

For example, a two variable function F(x,y) which is to be optimized in a continuous Cartesian space can be expressed as:

$$F(x,y)=(x+y)^4-(x-y)^2$$

where:

x ∈ [0, . . . , 5] and y ∈ [1, . . . , 4].

As an advantage of vector spaces, the concept of distance between objects can easily be defined, and therefore, the task to minimize the distance between items can use many different optimization techniques. For example, in a continuous vector space, a derivative function or a gradient descent technique can readily yields one or more minima.

In the case of permutation spaces, it is the order of the items which constitute the n-tupla of values that differentiates one input into the optimization from another. That is, the value of the variables in the n-tupla items at different positions are clearly dependent on each other. For example, a three variable function Q(x,y,z) described by a discrete permutation space can be expressed as:

$$Q(x,y,z)=(x \times P(x))+(y \times P(y))+(z \times P(z))$$

where:

x ∈ [1 . . . 3] and P(x)=the position of x in the permutation. In this case, valid permutation of Q(x,y,z) include:

Q(1,2,3)=1+4+9=14; Q(1,3,2)=1+6+6=13;

Q(2,1,3)=2+2+9=13; Q(2,3,1)=2+6+3=11;

Q(3,1,2)=3+2+6=11; Q(3,2,1)=3+4+3=10, and so forth, however

Q(1,2,2), Q(1,1,3), Q(3,3,2), etc. are non-valid permutations since a specific item appears more than once in the order.

Independent of the optimization technique used, dealing with vectors of variables is generally much easier than working with permutations. Optimizations in vector spaces typically use general methodologies, whereas in permutation spaces, dedicated methods have usually been required. This means that a method for one application may be of no use in another application.

Some workarounds are known for dealing with optimization problems in permutation spaces. One popular technique uses a penalty function. There, an input sequence of values is "penalized" the "farther" it is from a permitted permutation.

For example, it is desired to minimize a given objective function F(x), where the variable x can take on any integer value in the range 1, . . . , n, . . . Moreover, the value of F(x) is restricted to be in the range: min . . . max. A possible penalty function p(x) could be expressed as:

$$p(x)=1+\text{number of items with the same value} \times \text{min},$$

with a new penalized objective function:

$$F^*(x)=p(x) \times F(x).$$

In this case, all legal permutations still have the same old values, and illegal permutations are increasingly penalized according to the number of "wrong" items in the sequence.

In another technique, only permitted input values are generated during an iterative optimization process. For example, in methods for genetic applications, e.g., DNA analysis, special cross-over and mutation operators have been developed, or in simulated annealing techniques only swapping is allowed between items of a permutation.

For example, with genetic methods, at popular cross-over operator is the so called Partial Matched Cross-over (PMX), described by D. Goldberg in "Genetic Algorithms in Search Optimization&Machine Learning, Addison-Wesley, 1989, pp. 170–171. There, two chromosomes, one from each contributing parent are aligned, and two crossing sites are randomly selected.

The crossing sites define a matching section. The matching section identifies two genes that will be exchanged (swapped) in the chromosomes of the parents. For example, given two arbitrary DNA sequences:

1/2 4 7 8/3 5 6 representing a first parent, and
5/2 7 4 6/3 1 8 representing a second parent, with two random cross-over sites "|", the swapping of the matching sections {2 4 7 8} and {2 7 4 6} will produce:

1:2 7 4 6:3 5 6 a first child permutation, and
5:2 4 7 8:3 1 8 a second child permutation.

This is an easy-to-implement order-based cross-over. Unfortunately the semantics of the operation, and its practicality depend on the specific optimization problem to be solved. In many cases, the cross-over operator is ineffective, or not applicable at all.

Although both the penalizing function and the cross-over operator each offer advantages and disadvantages, they tend to obscure the problem by adding complexities to the optimizing methods, and therefore decrease their effectiveness.

It is desired to provide a general method that allows the best optimization techniques available for problems expressed in vector spaces to also be applied to all order based problems whose domains are represented in permutation spaces. The methodology should be applicable to real physical world problems, such as, for example, the optimal placement of interconnected components or modules in a surface plane of a semiconductor die. Here, it is desired to minimize the total length of interconnecting lines in order to maximize the performance of the components.

SUMMARY OF THE INVENTION

The invention provides a computer implemented method to optimally arrange items. The ordering of the items can be described as permutations of the arrangements. In one aspect of the invention, the items are electrical components to be placed in a surface plane of a semiconductor die. In this case, the optimal ordering minimizes the total length of the lines connecting the components.

The ordering of the items is described in a permutation space. In one aspect of the invention, the description of the permutations is stored as a data structure in a memory. The data structure can be in the form of a balanced tree where each node of the tree represents a possible permutation of the arrangements.

The ordering of the items is transformed from the description in the permutation space to a description of the ordering in a vector space. If there are N items, then the transformation is into an N−1 dimensional vector space. The transformation is done according to an inversion table which is derived from the balanced tree.

Now in the vector space, a best ordering of items is determined according to a predetermined criterion such as an objective function. In one aspect of the invention, the objective unction attempts arrange the components so that the total length of lines connecting the components is minimized. Once a best ordering has been determined, that order in the vector space is transformed back to permutation space using a binary composition operator which concatenates the vectors to generate the ordering in permutation space.

BRIEF DESCRIPTION OF THE DRAWINGS

FIG. 7 details the steps of an outer loop of an optimization process;

FIG. 9 details the steps of an inner loop of the optimization procedure;

DETAILED DESCRIPTION OF PREFERRED EMBODIMENTS

Transformations Introduced

Figure 1:
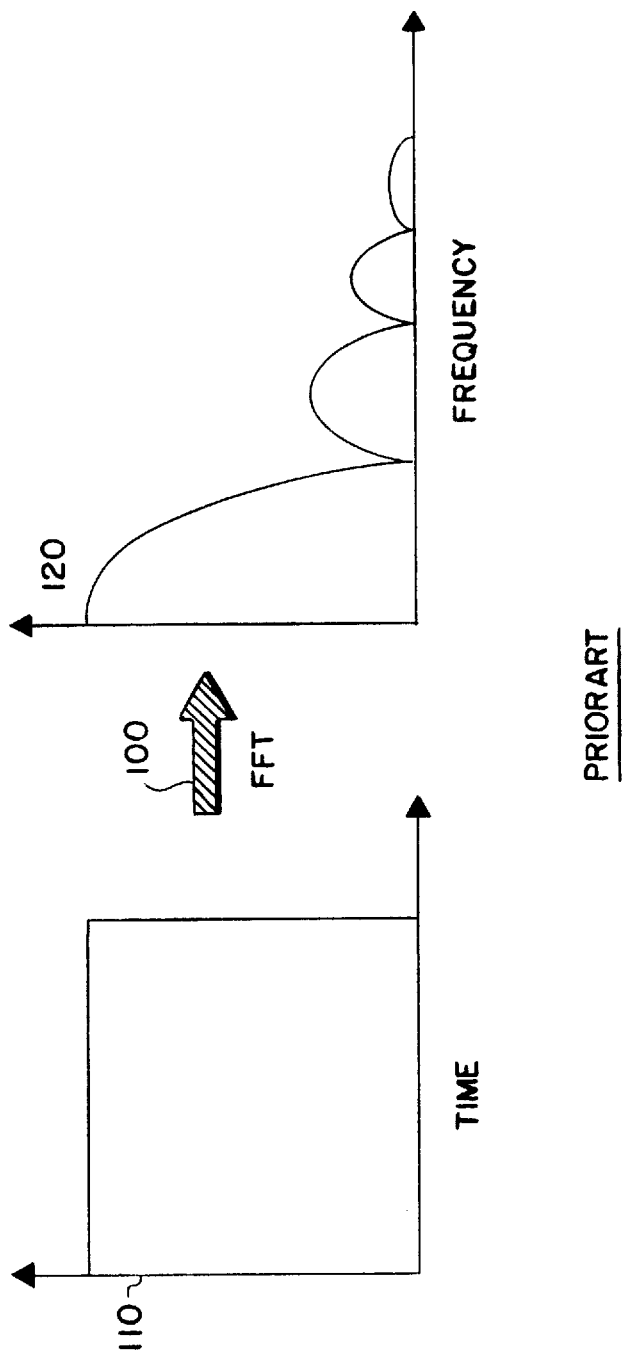
FIG. 1 shows a prior art transformation from a time to frequency domain.

In the art of physics and engineering, the concept of analytical transformation has successfully been applied to solve many difficult problems. A well known transformation is the Fourier transform. As shown in FIG. 1, a Fourier transform 100 allows an electrical signal to be "transformed" from a time domain 110 to a frequency domain 120.

Some of the most complex operations which are often applied to electrical signals are difficult to perform in the time domain 110. However, these operations become very simple in the frequency domain 120. For example, convolution of the signal is a complex problem to solve in the time domain 110, but the solution in the frequency domain 120 is relatively easy.

Indeed, it makes sense to convert the signal, do the work in the transformed space or domain, and use an inverse transform to get the convoluted signal back into the time domain. As long the effort required to convert between domains is small when compared with the effort to solve the problem in the transformed space or domain, the transformation is a worthwhile step.

Fourier Transforms

In the case of the Fourier transform, a fast improvement was made by the discovery of a new method with complexity $O(n \log n)$, instead of a complexity of $O(n^2)$ inherent in methods known at the time, please see, P. Cooley, "An Algorithm for the Machine Computation of Complex Fourier Series," Mathematics of Computation, Vol. 19, April 1965, pp. 297–301. With the Fast Fourier Transform (FFT), signal processing blossomed.

It is proposed that an analogous transformation methodology can be used to solve optimization problems in permutation spaces or domains. Described in further detail below is a generalized computer implemented method for transforming optimization problems set in permutation spaces to vector spaces. If the complexity in vector spaces is $O(n \log n)$, then linear operations can be carried out on corresponding vectors, before converting the optimal solution back to permutation spaces.

Almost all iterative optimization methods that operate on large search spaces use some heuristic to "guess" where the next "good" region to be sampled lies. Typically, the guess is based on some measurement which correlates with previous samples. When optimization problems are mapped into vector spaces, the distances between different sample points can be determined.

The measured distances can be used to search for optimal sample points by identifying "interesting" regions, e.g., regions which are more likely to produce an optimal solution, and avoiding regions which are less likely to lead to an optimal solution. To do this in permutation spaces is difficult.

Therefore, it is proposed that optimization problems posed in permutation space are transformed to vector space where the optimal solution is more readily obtainable. Then, using a reverse transform, the solution can readily be applied in a permutation space.

Inversion Table

According to the preferred embodiment of the invention, the transformation between permutation and vector spaces is carried out using an inversion table. Traditional uses of inversion tables are described by D. Knuth in "The Art of Computer Programming," Vol 3, Sorting and Searching, Addison-Wesley, 1911. There, the inversion table is purely used as a mathematical tool to prove theorems and properties of permutations.

In contrast, the present application describes an innovative use of inversion tables to solve optimization problems in permutation spaces, such as the optimal placements of millions of electrical components on a semiconductor die where many different orderings are possible.

An inversion table can formally be defined as follows. If permutations of items represented by n integers $\{a_1, a_2, \ldots, a_n\}$ are selected from the ordered set of integers $\{1, 2, \ldots, n\}$, then the inversion table $\{b_1, b_2, \ldots, b_j, \ldots, b_n\}$ is generated by letting $b_j$ be the number of items to the left of the jth item that are greater than the item.

Figure 2:
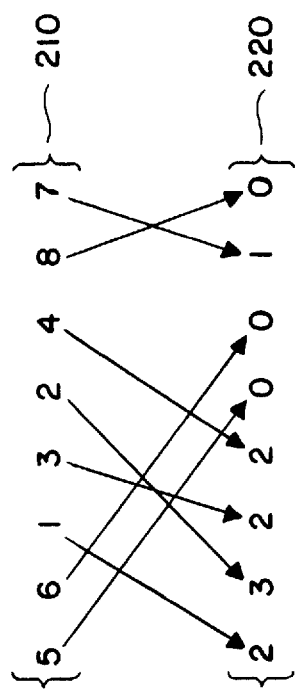
FIG. 2 is a chart for inverting a permutation.

As shown in FIG. 2, an example permutation $\{5\ 6\ 1\ 3\ 2\ 4\ 8\ 7\}$ 210 has an inversion table $\{2\ 3\ 2\ 2\ 0\ 0\ 1\ 0\}$ 220. Here, to the left of item 1, there are two items 5 and 6 that are greater than item 1, and to the left of item 2 there are three items 5, 6, and 3 that are greater than item 2, and so forth.

Note, that in alternative embodiments, different definitions may be possible. For example, one can count the number of items to the right of a given item $b_j$ using less than, instead of greater than for the comparison. By these definitions, the last item of the inversion table must always have a value of zero, and consequently, only n–1 components of the inversion table are meaningful.

The mapping of the inversion table can be formulated as:

$$b_{aj} = \sum_{i=1}^{i=j} \text{if } (a_i > a_j) 1; \text{else } 0$$

where $0<=b_1<n-1, 0<=b_2<n-2, \ldots, b_n=0$; and every $b_j$ can take values from a range that depends on its index j; $b_j \in \{0 \ldots n-j\}$. For the example permutation of FIG. 2 this yields:

$b_1 \in \{0 \ldots 7\}, b_2 \in \{0 \ldots 6\}, b_7 \in \{0\}$.

Described below is a preferred method for transforming and optimizing data structures representing physical items and problems expressed in permutation spaces. Once the transformation has taken place, generalized linear techniques can be applied to find an optimal solution.

The steps for transforming have a complexity of $O(n^2)$. Since the most interesting optimization problems deal with a large number of variables, e.g., the lay-out of a large number of components on a die, only techniques of complexity $O(n \log n)$, or better will be considered for the optimization portion of the present method.

Fast Inversion Table Transform

The fast inversion table transform (FITT) according to the preferred embodiment can be implemented in an object-oriented programming language such as C++, please see the Appendix attached hereto. The FITT and its inverse are implemented as a C++ general class object called InvTab which, apart from its constructor and destructor objects, also includes two members objects decode, and encode. These two objects respectively transform permutations and vectors.

Data Structures

Figure 3:
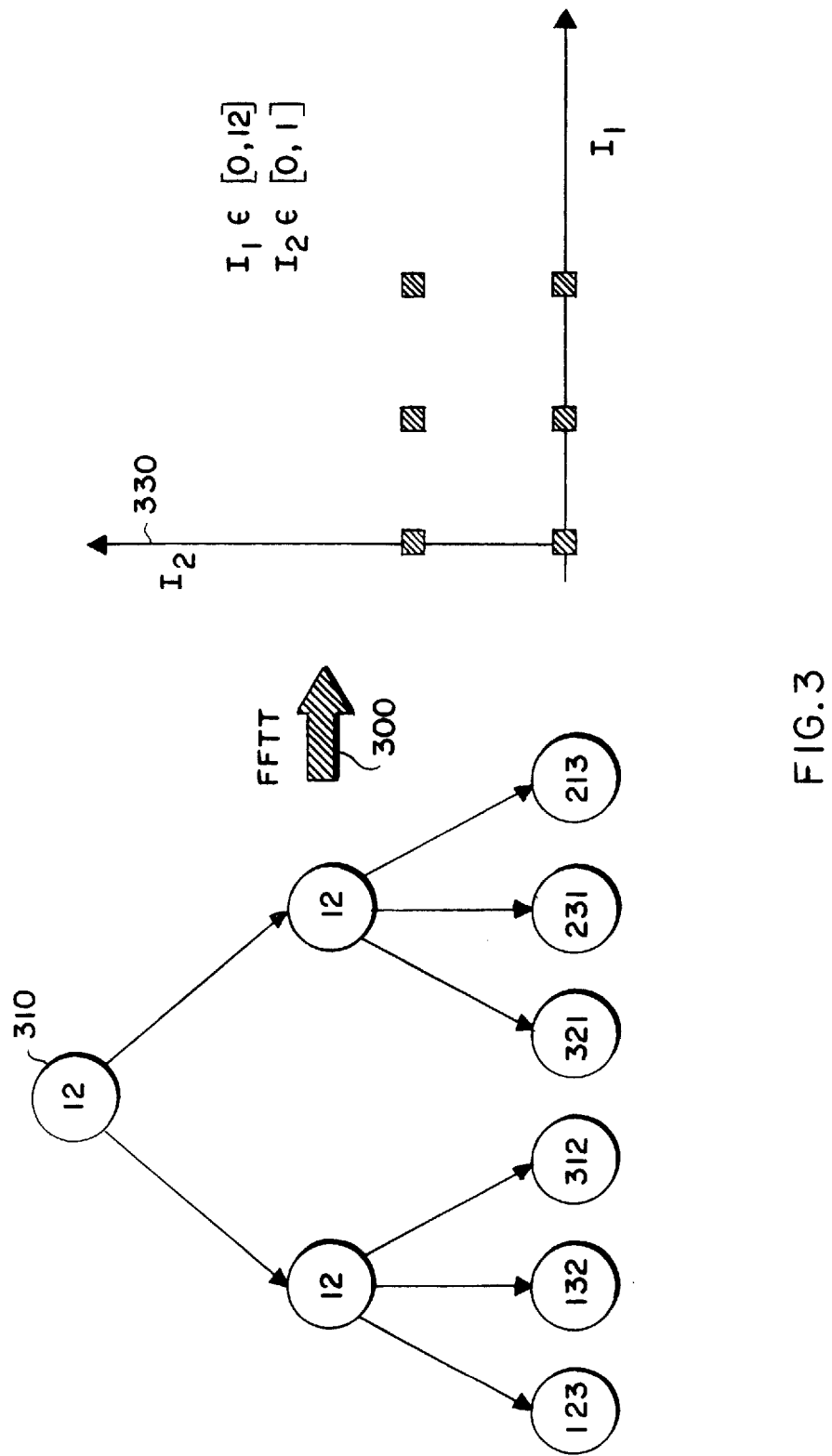
FIG. 3 shows a fast inversion table transform (FITT) according to the invention.

FIG. 3 shows the basic data structure used during the fast inversion table transformation (FITT) 300 from the permutation space to the vector space. A data structure representing possible orderings of items is stored in a memory as a balanced tree 310. The tree 310 embodies all the possible permutations of, for example, three items $\{1\ 2\ 3\}$. Although, the method described herein operates on balanced trees, other data structures, for instance, red-black trees can also be used.

A linear data structure, the array 320, represents the correspondent transformed vector space. Here, all the permutations of the three items are uniquely converted into vectors $I_1$, and $I_2$. The items of the vectors respectively take values in the ranges [0, 1, 2], and [0, 1]. In other words, a permutation space of n items is transformed into an n–1 dimensional linear (vector) space.

Figure 4:
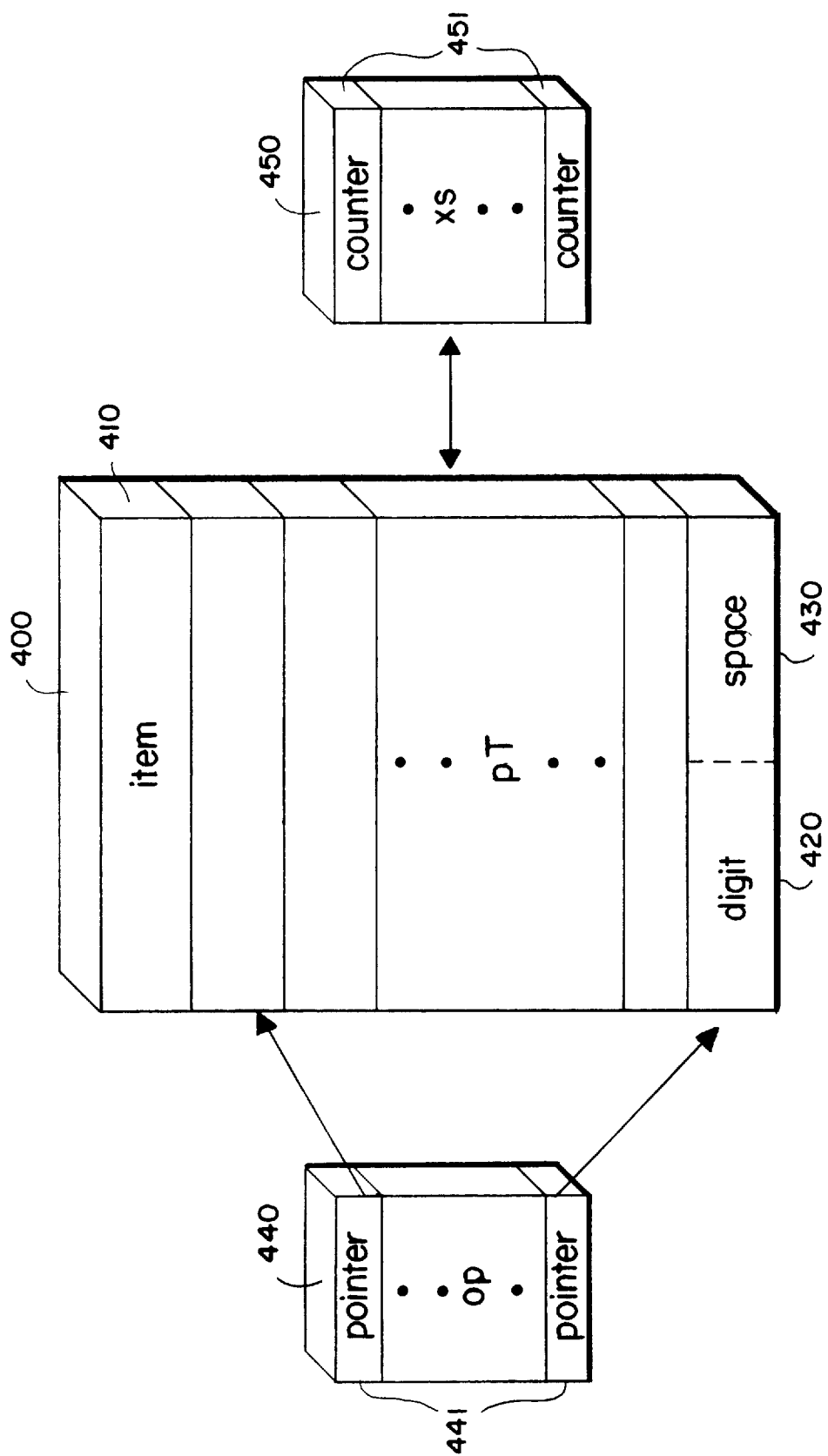
FIG. 4 is a block diagram of data structures used be the FITT of FIG. 3.

As shown in FIG. 4, the basic data structure for storing the inversion table can be a linked list pT 400. The insertions and deletions of each item 410 is conventionally done. The linked list pT 400 is generated in an initialized form by the constructor object when the class object InvTab is invoked.

Each item 410 includes two fields. The fields store two values digit 420 and space 430. The value digit 420 represents a particular item. That is, the value of digit can be an encoding of all significant attributes of a physical or virtual item. For the purpose of optimally ordering items, manipulating this value can be considered equivalent to manipulating the item itself. The value space 430 represents the number of qualifying items to the left of the item, assuming the encoding is in accordance with the example shown in FIG. 2. In other words, the space values indicate the relative placement of the items in a particular instance of ordering.

In addition to the linked list, and arrays op 40 is used to store pointers 441 to items of the list 400, and an array xs 450 stores counters 451 that are used while processing list items during the transformations. The data structures of FIG. 4 can be stored in a memory of a computer system.

Permutations take integer values on the range $(1, 2, \ldots, n)$, and the corresponding vectors on the range $\{0, 1, \ldots, n-1\}$. The last component of a vector is always zero.

Figure 5:
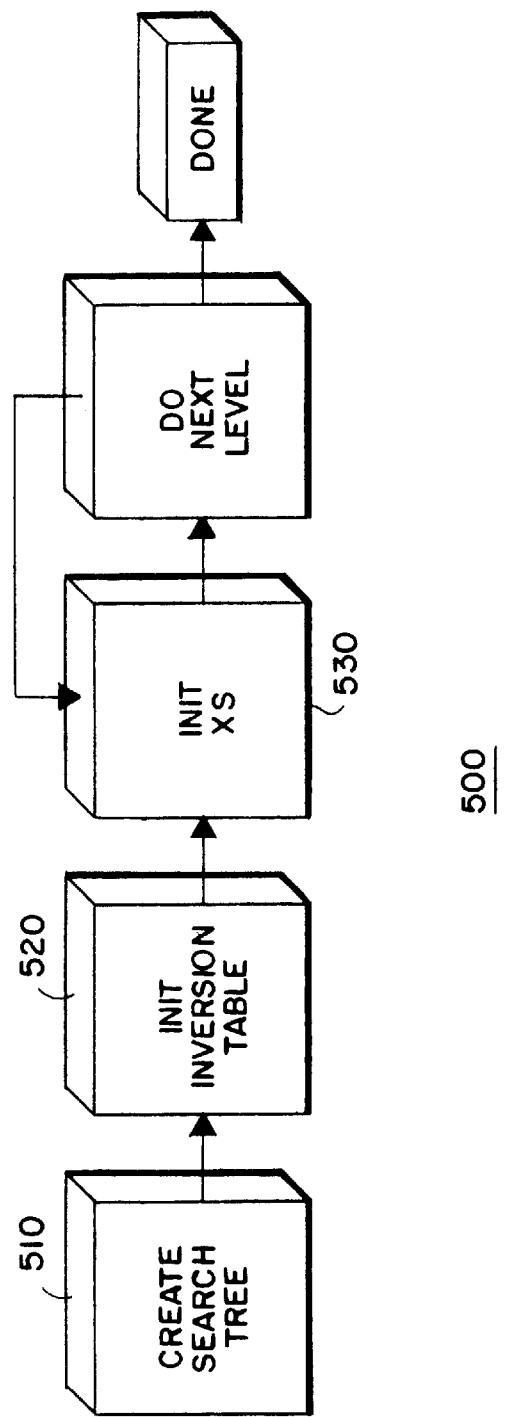
FIG. 5 is a flow diagram of a process for transforming items from permutation to vector space.

From Permutation to Vector Space: $\{a_1, a_2, \ldots, a_n\} \rightarrow \{b_1, b_2, \ldots b_n\}$ FIG. 5 shows the sub-steps of transforming an ordering of items from a permutation space to description of the ordering in a vector space, e.g., the steps are performed by the procedure encode. The steps determine, for each item at a given position in a permutation, the number of items that precede on the left of the item.

In order to make this process efficient, the permutations are represented in the form of the search tree 310 of FIG. 3 in step 510. This way only n log n levels of the tree need to be updated. The inversion table 400 of FIG. 4 is initialized in step 520. The array of counters xs 450 is initialized with zeroes at each log n iteration of each level of the tree 310.

During each iteration, each bit of any item $a_i$ is accessed by an appropriate shift operation, and the array xs 450 is updated according to the value of the bit shifted out. At completion, the pointers of array op 440 will point at the items 410, whose space fields 430 will be index into the array $\{b_1, b_2, \ldots, b_n\}$, and whose digit fields 420 will store the count of the qualifying preceding items. At completion, a left shift of one position is necessary since items of the permutation take on values in the range of $\{1, 2, \ldots, n\}$ at positions $\{0, 1, \ldots, n-1\}$. The C++ code which implements these steps for procedure encode, as well as the other procedures described herein, are listed in the Appendix.

From Vector to Permutation Space: $\{b_1, b_2, \ldots, b_n\} \rightarrow \{a_1, a_2, \ldots, a_n\}$ For a string (or list) of items of the type item 410 such as:

$\alpha = [m_1, n_2], \ldots [m_n, n_n]$, and an empty string $\epsilon = 0$, a binary composition "$\otimes$" can be defined. The binary composition $\otimes$ takes two strings $([m, n]\alpha)$, and $([m', n']\beta)$, where $\alpha$ and $\beta$ are sub-strings without the first two items, and creates a new string according to a rule [1]:

$([m, n]\alpha) \otimes ([m', n']\beta) = ([m, n](\alpha \otimes ([m'-m, n']\beta))$ if $m \leq m'$, and $([m', n']([m-m'-1, n]\alpha) \otimes \beta)$. [1]

if $m < m'$
where:

$\epsilon \otimes \alpha$, and $\alpha \otimes \epsilon$ and the operator $\otimes$ are associative, that is:

$\alpha \otimes (\beta \otimes \gamma) = (\alpha \otimes \beta)$.

Therefore, it is true that:

$[b_1 1] \otimes [b_2, 2] \otimes, \ldots, [b_n, n] = [0, a_1][0, 9_2] \ldots [0, a_n]$ [2]

In words, this means that the composition of a list of items whose field space is determined from the inversion table value, and the field digit goes from 1 to n, generates the ordering of the corresponding items of the initial permutations.

The time required to evaluate the above composition is on the order of O(n log n). Note, since the operator $\otimes$ is a composition which is associative, the terms of the expression on the left side of the equality [2] can be determined in any order.

This is exactly what is done by the procedure decode when invoked with the inversion table as an input variable. Note, that a divide and conquer technique can be used on the initial input list of the expression to be evaluated. During each iteration i of the procedure decode, the values op[i], e.g., the pointers 441, point to the result of the composition of the sub-strings being evaluated according to the rule [1]. The end of the string can be identified by an item that has a zero value, e.g., an empty string.

Figure 6:
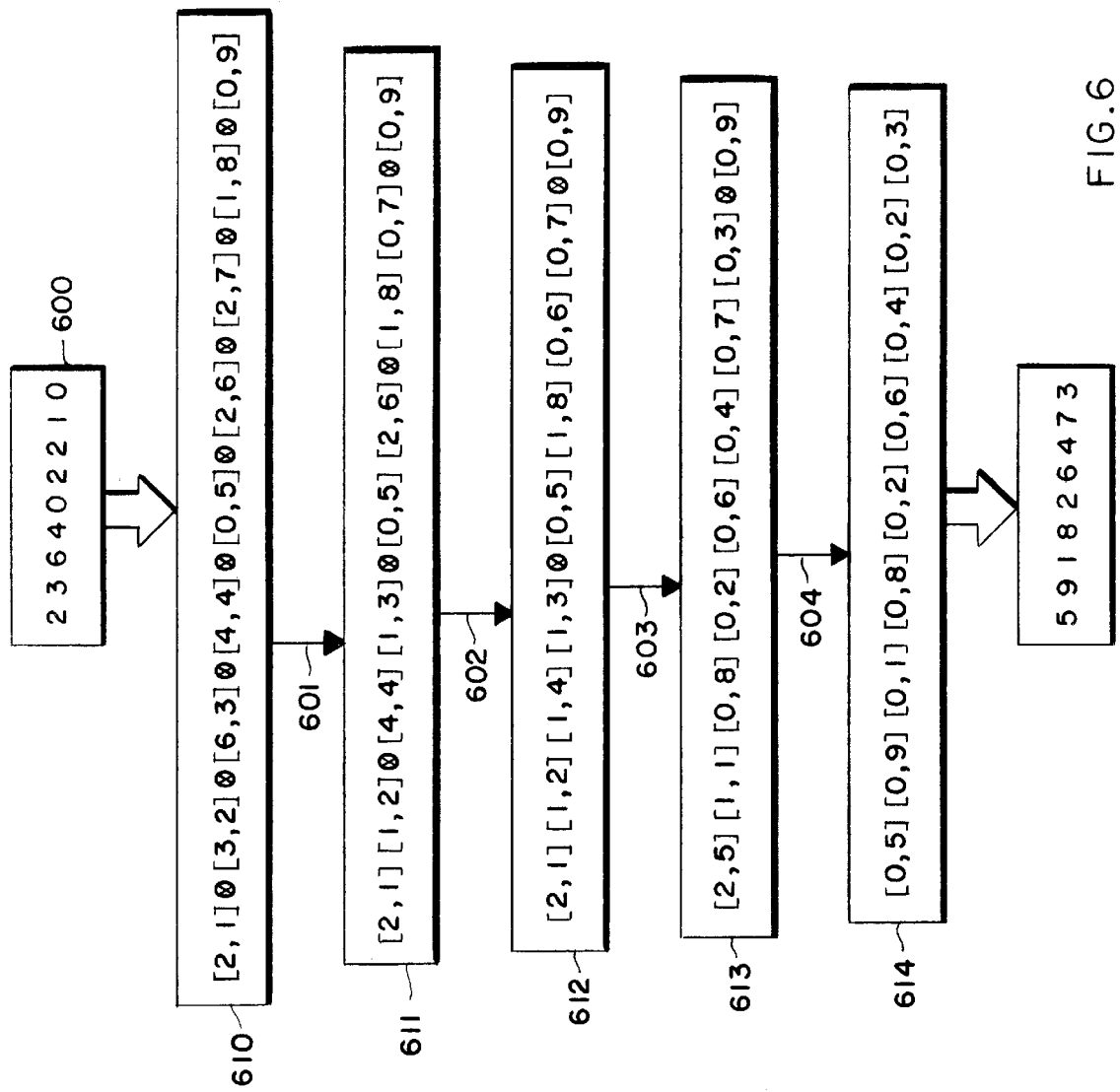
FIG. 6 shows a composition for transforming from vector to permutation spaces.

As shown in FIG. 6, given an inversion table 600 which stores the values [2 3 6 4 0 2 2 1 0], four iterations 601–604 are needed to transform a list 610 of nine items to produce the permutation [5 9 1 8 2 6 4 7 3 ] 620, with intermediate compositions 611–614 using rule [1]. The permutation 620 is an example best ordering of nine items.

During the first pass 601 adjacent pairs are evaluated. In the second pass 602, the adjacent sub-strings 611 with two items are evaluated. The third pass 603 evaluates the adjacent sub-strings 612 of four items. And the last pass 604 produces the resulting permutation 614, which is:

[5 9 1 8 2 6 4 7 3] 620.

Application of Generalized Method to Circuit Placement

The design of VLSI circuits requires a solution to a difficult ordering problem which is expressed in permutation space, namely, how to optimally place components in a plane so that the length of the interconnecting signaling paths is minimized, then, timing requirements can be met.

To solve this problem, an optimizing technique, which is normally used to optimize objective function of any kind in a continuous Cartesian space, is applied. However, in a discrete permutation space, derivatives that can usually determine a minimum (or maximum) in a continuous space are generally not available, or impossible to determine.

More specifically, a modified dynamic hill climbing technique is applied to a physical placement problem which is first described in a permutation space. Although, dynamic hill climbing may not provide the best result, it demonstrates that the idea of how an FITT can be used to allow optimization functions intended for Cartesian space can also deal with ordering problems expressed in permutation spaces.

A traditional hill climbing technique, as applied to continuous linear space, is described in "Dynamic Hill Climbing," D. Yuret and M. De La Maza, AI Expert, March 1994, pp. 26–31. For the present application, the technique is modified to work in the discrete space generated by the FITT, instead of the continuous space as described by Yuret and De La Maza.

Figure 8C:
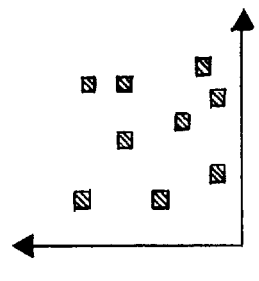
FIGS. 8a–8c graphs details of items to be searched.
Figure 8B:
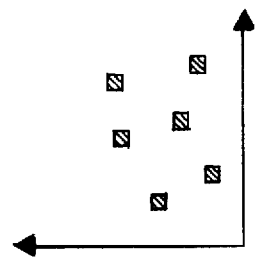
Figure 8A:
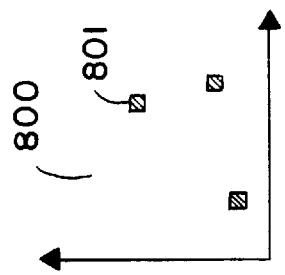
Figure 10B:
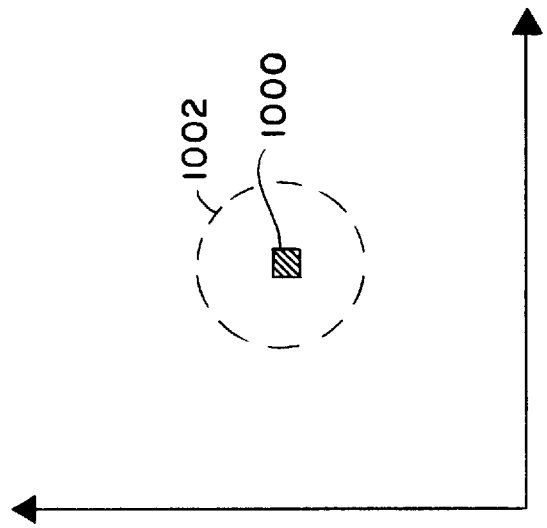
FIGS. 10a–10b graph better and worse search regions.
Figure 10A:
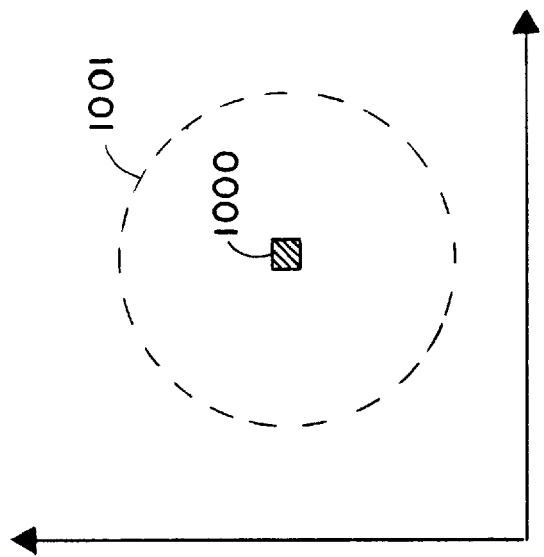
Figure 11C:
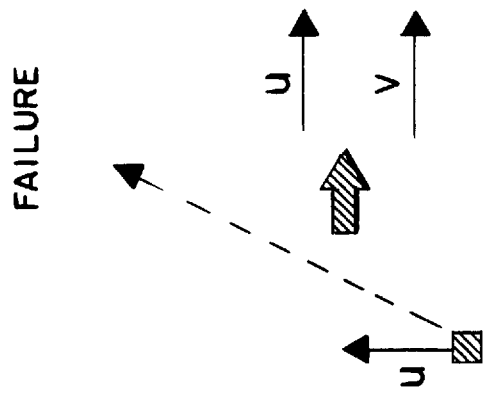
FIGS. 11a–11c show combinations of vectors.
Figure 11B:
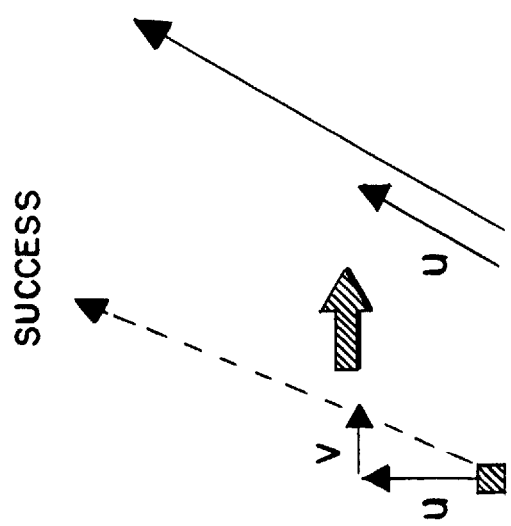
Figure 11A:
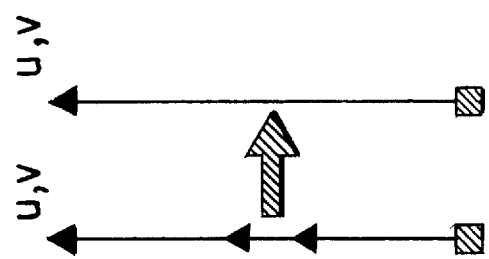

The general method will be described with reference to FIGS. 7–11. FIGS. 7 and 9 are components of a two loop optimizing procedure. FIGS. 8a–8c shows the search space 800 around items 801. FIG. 10a and 10b show how the size of the search area can grow and shrink. FIGS. 11a–11c shows how search vectors can be combined.

The method can be implemented as a two loop procedure. An outer loop 700, shown as the pseudo-code of FIG. 7, explores the search space around a given starting items x 801 as uniformly as possible. The item x, as should be clear by now, is expressed as a vector. A set X, initially empty, will contain as members, items (vectors) which satisfy a local optima determined by the method.

An objective function f(x), takes a vector x as input. FarPoint is a procedure which determines a new "farthest" item from all items which are members of the set X. The procedure LocalOptima is an inner loop described below, which, given the objective function f(x), and an item x, returns the best local optimal item, according to some predetermined rule.

During operation, the outer loop 700 is iterated through i until the number of new farthest items which have been have determined is equal to the threshold value maxOptima. This implements the idea of a so called "iterative deepening" by exploring the vector space in increasing detail as graphically shown in FIGS. 8a–8c, with FIG. 8c having a much greater level of detail than FIGS. 8a and 8b.

The pseudo-code 900 for the inner loop LocalOptima is shown in FIG. 9. Essentially, the idea is to begin with some starting item x, and a probing vector v. The size of the vector v increases and decreases depending on the current value of the objective function for a current new item. That is, "better" or more optimal items are rewarded, and "worse" items are penalized as v shrinks. The coordinates of the best item so far are given by combining vectors u+v.

Until a better item is found for a current sized vector v, directions are randomly tried until the maximum number of iterations is equal to maxIter. If a new item is better than a previous one, the probing vector doubles in size, and further regions in the space can be searched, otherwise the vector is penalized by halving it, and only closer regions are searched.

These situations are respectively shown in FIGS. 10a and 10b with the circles 1001 and 1002 indicating the relative size of the search regions around a point x 1000 in a two-dimensional search space for better (longer) and worse (shorter) vectors.

As shown in FIGS. 11a–11c, the vector v maintains a previously determined direction which improves the search in the case where the search space is multi-dimensional. The vector v is linearly combined with the vector u, and a new "promising" direction is then tried.

FIG. 11a shows the case where there is no change in direction, FIG. 11b show were a better direction is successfully found, and FIG. 11c show the case where there is a failure in finding a better direction. The inner loop 900 of FIG. 9 terminates when the size of vector v reaches a minimum to yield an optimal solution.

At this point, the outer loop 700 can proceed to minimize the value of the given objective function f(x) until the absolute value |v| is smaller than a predetermined threshold value.

It is demonstrated that the fast inverse table transform method can be applied to real world ordering and placement problems. For example, the method can be used to optimally place interconnected components on a die in order to minimize the total length of the connection.

Figure 12:
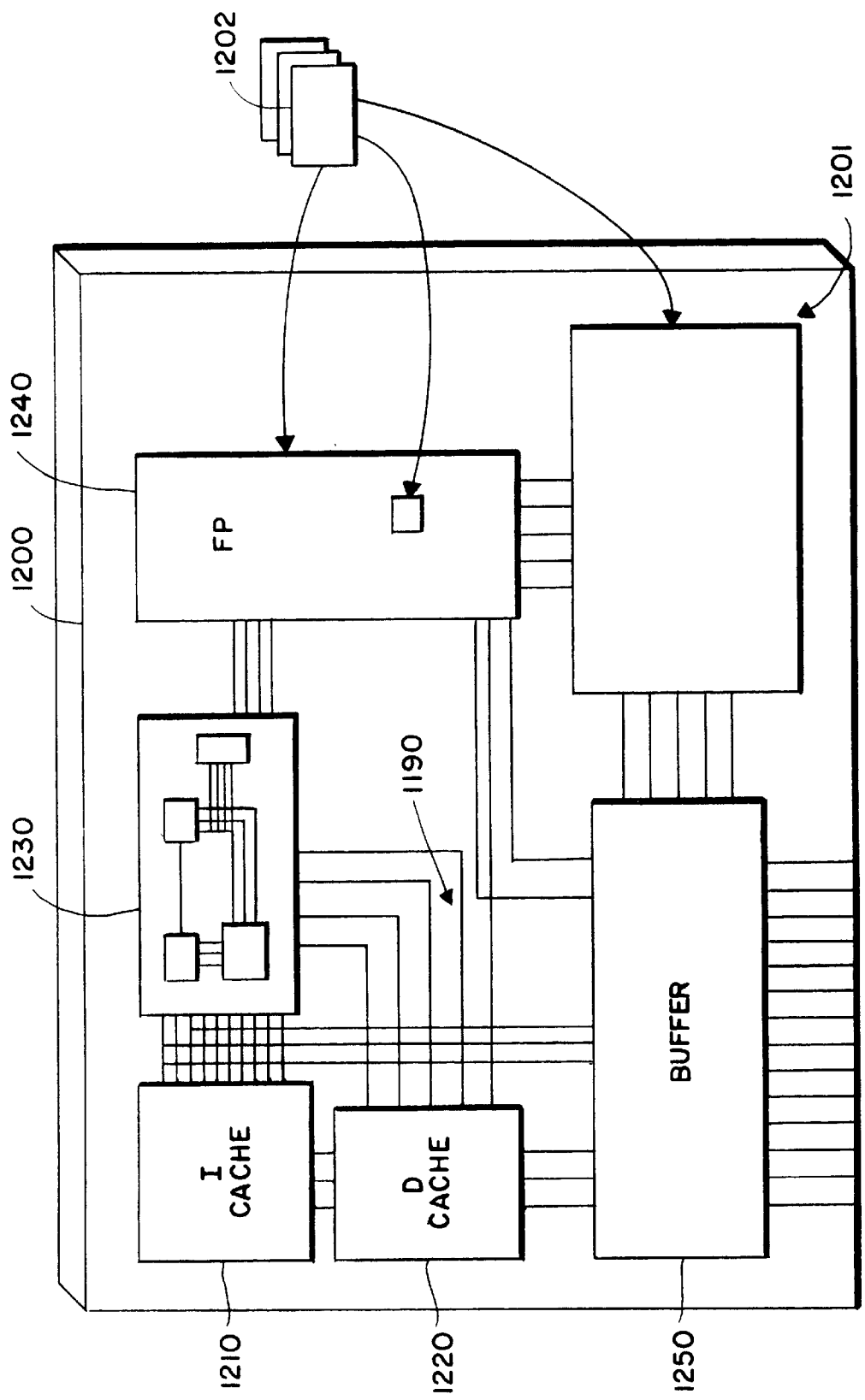
FIG. 12 is a block diagram of items to be placed on a semiconductor die according to the method of the invention.

As shown in FIG. 12, a semiconductor die 1200 including a plurality of modules such an instruction cache 1210, a data cache 1220, one or more processors 1230, a floating point processor 1240, a buffer 1250, and so forth. Each of the modules, may in turn, include many thousands of active components or "cells." The components can be identified by integer values 1202.

The modules and their component parts are to be connected by lines generally indicated by reference numeral 1290. The semiconductor components are to be placed in a plane which is substantially parallel to a side surface 1201 of the die 1200.

Possible physical placements then can be represented in a memory of a computer system as permutations of the integer values 1202 representing attributes of the components as described above. Applying the transforms, and using known rules and constraints, actual optimal coordinates can be determined for the components.

Although for this specific problem, a dynamic hill climbing technique is used as the optimizing function, other optimizing techniques that work well in multi-dimensional continuous vector space can be applied.

For example, in the case that gradient information is not available, or impossible to get, as in the case of discrete space for instance, a modified Powell's method can be used. Powell's method is described for continuous search spaces, and therefore, cannot be used unless the transformation as described herein is first performed.

In Powell's method, a set of directions that are used during the search of an n-dimensional space are vectors:

$\{u_1, u_2, \ldots, u_n\}$.

Any well known line minimization method can be used. The line minimization moves along the direction of each vector until an optimum point is found. From there, the search can proceed along a second direction to its optimum, and so on, cycling through the entire set of vectors as many times as necessary, until the function stops increasing or decreasing.

The basic steps of the method operate as indicated in the pseudo code of Table 1 below.

TABLE 1

| | |
|---|---|
| 1 | Save the initial starting point as $P_0$; |
| 2 | For i = 1, . . . n move $P_{i-1}$ to a minimum along the direction of vector $u_i$, call this point $P_i$; |
| 3 | For i = 1 . . . n-1 set $u_i = u_{i+1}$; |
| 4 | Set $u_n = P_n - P_0$; |
| 5 | Move $P_n$ to the minimum along direction $u_n$ and call this point $P_0$. |

For a quadratic form, k iterations of the above procedure produce a set of directions $u_i$ whose last k members are mutually conjugate. Therefore n iterations of the basic procedure, amounting to n(n+1) line minimizations in total, will exactly minimize a quadratic form. For non-quadratic forms, there are other known minimizations methods that will converge to yield acceptable results.

Although, the above method is described in terms of a minimization, a maximization can be used just as well.

The foregoing description has been directed to specific embodiments of this invention. It will be apparent, however, that variations and modifications may be made to the described embodiments, with the attainment of all or some of the advantages. Therefore, it is the object of the appended claims to cover all such variations and modifications as come within the spirit and scope of the invention.

```
#if !defined(TRANSFORM_DEF)
#define TRANSFORM_DEF
typedef struct item * pitem;
typedef int * pGene;
struct item
{
    int space;
    int digit;
    pitem next;
};
class InvTab
private:
    pitem_fastcall decode(pitem, pitem);
    int     max;                      //max vector length
    int     lim;                      //2^lim<=max<2^(lim+1)
    pitem * op;
    int    * xs;
    pitem  pList;
public:
    InvTab(int=8);
    ~InvTab();
    void_fastcall decodeInvTab(pGene, pGene);
    void_fastcall encodeInvTab(pGene, pGene);
};
//         recursive implementation
inline pitem_fastcall InvTab::decode(pitem p1, pitem p2)
{
    pitem pT;
    if(!p1) return p2;
    else
        if(!p2)return p1;
        else
        {
           if(p1->space<=p2->space)
           {
              p2->space=p2->space-p1->space;
              p1->next=decode(p1->next, p2);
           }
           else
           }
              pT=p1;
              p1=p2;
              p2=pT;
              p2->space-=(p1->space+1);
              p1->next=decode(p2, p1->next);
           }
           return p1;
        }
}
inline void_fastcall InvTab::decodeInvTab(pGene p, pGene q)
{
    pitem pT;
    int i,j,k,l;
    pT=op[0]=pList;
    for(i=0; i<max;)          //build and initialize the internal list
    {
        pT->space=p[i];
        pT->digit=++i;
        pT->next=0;
        op[i]=++pT;
    }
    for(l=1,k=2;1<max;1*=2,k*=2)
```

-continued

```
        for(i=0,j=1;j<max;i+=k,j+=k)
            op[i]=decode(op[i],op[j]);
        pT=op[0];
        for(i=0;i<max;++i,pT=pT->next)          //copy result
            q[i]=pT->digit;
}
inline void__fastcall InvTab::encodeInvTab(pGene p, pGene q)
{
    pitem pT;
    int i,j,k,s,r;
    pT=op[0]=pList;
    for(i=0;i<max;)                             //initialize the internal list
    {
        pT->space=p[i];
        pT->digit=0;
        op[++i]=++pT;
    }
    for(k=lim;k>=0;--k)
    {
        for(j=0;j<(max>>(k+1));++j)xs[j]=0;
        for(j=0;j<max;++j)
        {
            r=(op[j]->space>>k)%2;
            s=op[j]->space>>(k+1);
            if(r)++xs[s];else op[j]->digit+=xs[s];
        }
    }
    for(i=0;i<max;++i)
    {
        q[op[i]->space-1]=op[i]->digit;
    }
}
#endif
#include <iostream.h>
#include <stdlib.h>
#include <math.h>
#include "transform_1.h"
InvTab::InvTab(int s):max(s)
{
    pitem pT1, pT2;
    if(s !=0)
    {
        op=new pitem [max +1];                  //create list of items
        pT1=pList=new item [max +1];
        op[0]=pT1;
        for(int i=0;i<max;++i)
        {
            pT2=pT1+1;
            pT1->next=pT2;
            pT1=pT2;
        }
        pT1->next=0;
        xs=new int [max/2+1];
        lim=int(log(double(max))/log(2.0));
    }
    else
    {
        op=0;
        xs=0;
    }
}
InvTab::~InvTab()
{
    if(xs !=0)delete [] xs;
    if(op !=0)
    {
        delete [] pList;
        delete [] op;
    }
}
```

I claim:

1. A computer implemented method for ordering items, the ordering of the items being described in a permutation space, comprising the steps of:

transforming the ordering of the items from the description in the permutation space to a description of the ordering in a vector space;

determining a best ordering of items in the vector space according to a predetermined criterion;

transforming the best ordering of the items as determined in the vector space to a best ordering of the items in the permutation space.

2. The method of claim 1 further comprising:

transforming permutations of N items in the permutation space to an N−1 dimensional vector space.

3. The method of claim 1 further comprising:

representing the ordering of the items in the permutation space as a data structure in the form of a tree;

determining an inversion table from the tree;

generating a plurality of vectors from the tree using the inversion table.

4. The method of claim 3 further comprising:

storing the inversion table in a memory of a computer as a linked list of entries, each entry associated with one of the items, each entry including a digit field and a space field, the digit field describing one of the items, and the space field indicating the number of items ordered to the left of a particular item that are greater than the particular item.

5. The method of claim 1 wherein the items are components of a semiconductor circuit, the components to be substantially placed in a planar surface of the die, and where the predetermined criterion is to place the components in a best order so that the total length of lines connecting the components is minimized.

6. The method of claim 5 further comprising;

wherein each component is described as a set of integer values, and the orderings are permutations of the sets of integer values.

7. The method of claim 3 further comprising:

applying an objective function to the plurality of vectors to determine the best ordering.

8. The method of claim 7 further comprising:

increasing the size of a probing vector if a current value of the objective function decreases; and decreasing the size of the probing vector if the current value of the objective function decreases.

9. The method of claim 8 further comprising:

determining the best ordering when the current value of the objective function is less than a predetermined minimum value.

10. A computer implemented method for ordering items, the ordering of the items being described in a permutation space, comprising the steps of:

storing a description of the ordering in a memory;

transforming the ordering of the items from the description in the permutation space to a description in a vector space stored in the memory using an objective function;

determining a best ordering of items in the vector space according to a predetermined criterion; and transforming the best ordering of the items as determined in the vector space to a best ordering of the items in the permutation space.

11. The method of claim 10 further comprising:

representing the ordering of the items in the permutation space as a data structure in the form of a tree stored in the memory;

determining an inversion table from the tree;

generating a plurality of vectors from the tree using the inversion table.

12. The method of claim 11 further comprising:

storing the inversion table in the memory as a linked list of entries, each entry associated with one of the items, each entry including a digit field and a space field, the digit field describing one of the items, and the space field indicating the number of items ordered to the left of a particular item that are greater than the particular item.

* * * * *